United States Patent
Takada

(10) Patent No.: US 10,026,634 B2
(45) Date of Patent: Jul. 17, 2018

(54) ELECTROSTATIC CHUCK AND BASE MEMBER FOR USE IN THE SAME

(71) Applicant: SHINKO ELECTRIC INDUSTRIES CO., LTD., Nagano-shi, Nagano (JP)

(72) Inventor: Kazuya Takada, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 310 days.

(21) Appl. No.: 14/887,514

(22) Filed: Oct. 20, 2015

(65) Prior Publication Data
US 2016/0118285 A1 Apr. 28, 2016

(30) Foreign Application Priority Data

Oct. 22, 2014 (JP) ................ 2014-215635

(51) Int. Cl.
*H01L 21/683* (2006.01)
*H01L 21/67* (2006.01)

(52) U.S. Cl.
CPC .... *H01L 21/6831* (2013.01); *H01L 21/67109* (2013.01)

(58) Field of Classification Search
CPC .............. H01L 21/6831; H01L 21/67109
See application file for complete search history.

(56) References Cited

U.S. PATENT DOCUMENTS

| | | |
|---|---|---|
| 5,634,266 A | 6/1997 | Sherstinsky et al. |
| 5,656,093 A | 8/1997 | Burkhart et al. |
| 5,667,622 A | 9/1997 | Hasegawa et al. |
| 5,671,117 A | 9/1997 | Sherstinsky et al. |
| 5,737,178 A | 4/1998 | Herchen |

(Continued)

FOREIGN PATENT DOCUMENTS

| | | |
|---|---|---|
| JP | H08-46019 | 2/1996 |
| JP | H09-205080 | 8/1997 |

(Continued)

OTHER PUBLICATIONS

Taiwanese Office Action with English Translation, dated Feb. 6, 2018, 6 pages.

(Continued)

*Primary Examiner* — Scott Bauer
(74) *Attorney, Agent, or Firm* — Rankin, Hill & Clark LLP

(57) ABSTRACT

An electrostatic chuck includes a base member and an electrostatic chuck substrate. The base member includes a cooling path. The electrostatic chuck substrate is connected to an upper surface of the base member through an adhesive layer so as to attract a substrate to be mounted. The cooling path includes an introduction portion, a discharge portion and a conduit. The cooling medium is introduced from an outside of the base member to the introduction portion. The cooling medium is discharged from the discharge portion. The conduit includes a start end portion communicating with the introduction portion and a final end portion communicating with the discharge portion. The introduction portion is inclined toward a lower surface of the base member and at a predetermined angle with respect to an axis perpendicular to the upper surface. The introduction portion extends from the lower surface toward the start end portion.

10 Claims, 6 Drawing Sheets

(56) References Cited

U.S. PATENT DOCUMENTS

| | | |
|---|---|---|
| 5,812,362 A | 9/1998 | Ravi |
| 5,883,778 A | 3/1999 | Sherstinsky et al. |
| 6,179,921 B1 | 1/2001 | Ruffell et al. |
| 6,740,853 B1 | 5/2004 | Johnson et al. |
| 2005/0219786 A1 | 10/2005 | Brown et al. |
| 2013/0120897 A1 | 5/2013 | Lin et al. |
| 2014/0209245 A1 | 7/2014 | Yamamoto et al. |
| 2015/0187625 A1* | 7/2015 | Busche .............. H05K 7/20218 361/234 |

FOREIGN PATENT DOCUMENTS

| | | |
|---|---|---|
| JP | 9-289201 | 11/1997 |
| JP | H10-070181 | 3/1998 |
| JP | 11-026565 | 1/1999 |
| JP | 2006-332518 | 12/2006 |
| JP | 2011-082405 | 4/2011 |
| JP | 2013-122067 | 6/2013 |
| JP | 2014-150104 | 8/2014 |

OTHER PUBLICATIONS

Japanese Office Action dated Apr. 3, 2018, English abstract included, 6 pages.

\* cited by examiner

US 10,026,634 B2

ELECTROSTATIC CHUCK AND BASE MEMBER FOR USE IN THE SAME

CROSS-REFERENCE TO RELATED APPLICATION(S)

This application claims priority from Japanese Patent Application No. 2014-215635, filed on Oct. 22, 2014, the entire contents of which are herein incorporated by reference.

BACKGROUND

Field

Exemplary embodiments of the invention relate to an electrostatic chuck and a base member for use in the same.

Related Art

Semiconductor devices are manufactured by a deposition apparatus (such as a CVD apparatus or a PVD apparatus) and a plasma etching apparatus. These apparatuses have a temperature adjustment device that adjusts the temperature of a substrate (such as a silicon wafer) in a decompressed processing chamber. As the temperature adjustment device, there has been known an electrostatic chuck that electrostatically attracts a substrate and holds the substrate on a holding base thereof (for example, see JP H09-289201 A, JP H11-026565 A (corresponding to U.S. Pat. No. 5,737,178), and JP 2011-082405 A). The electrostatic chuck includes a base plate and an electrostatic chuck (ESC) substrate bonded to the base plate. The electrostatic chuck substrate includes an electrode and a heating element. The electrode attracts a substrate. The heating element controls the temperature of an object to be attracted (for example, a substrate). Also, a cooling path is formed in the base plate. The temperature of the substrate attracted onto an upper surface of the electrostatic chuck substrate is adjusted by a cooling medium and the heating element. The cooling medium flows in the cooling path formed in the base plate. The heating element is built in the electrostatic chuck substrate.

SUMMARY

There may be, however, unevenness in temperature in the cooling path formed in the base plate. The unevenness in temperature would cause unevenness in temperature in an upper surface of the base plate, which may lead to unevenness in temperature in the substrate. The unevenness in temperature in the substrate would cause, for example, unevenness in etching rate in a plasma etching apparatus, which may lead to deterioration in yield of semiconductor devices.

According to one exemplary embodiment, an electrostatic chuck includes a base member and an electrostatic chuck substrate. The base member includes a cooling path through which a cooling medium flows. The electrostatic chuck substrate is connected to an upper surface of the base member through an adhesive layer so as to attract and retain a substrate to be mounted on an upper surface of the electrostatic chuck substrate. The cooling path includes an introduction portion, a discharge portion and a conduit. The cooling medium is introduced from an outside of the base member to the introduction portion. The cooling medium is discharged from the discharge portion to the outside of the base member. The conduit includes a start end portion and a final end portion. The start end portion communicates with the introduction portion. The final end portion communicates with the discharge portion. The introduction portion is inclined toward a lower surface of the base member and at a predetermined angle with respect to an axis perpendicular to the upper surface of the base member. The introduction portion extends from the lower surface of the base member toward the start end portion of the conduit.

With this configuration, it is possible to achieve an advantageous effect that unevenness in temperature can be reduced.

DETAILED DESCRIPTION

Figure 1A:
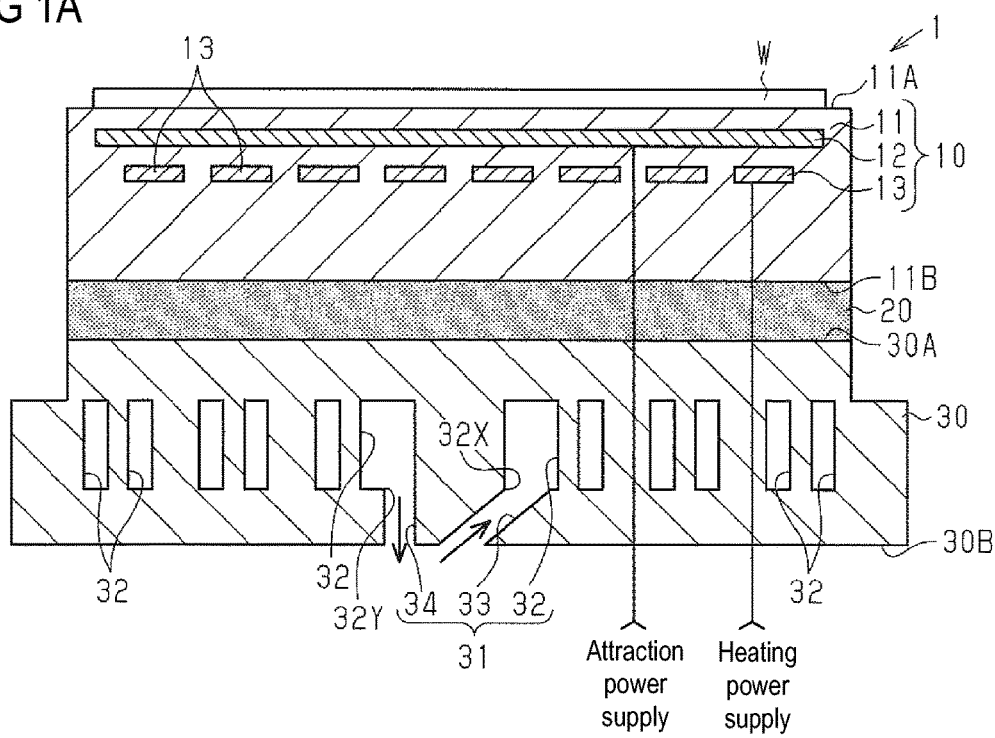
FIG. 1A is a schematic sectional view showing an electrostatic chuck according to an exemplary embodiment.

Exemplary embodiments will be described below with reference to the accompanying drawings.

For the purpose of facilitating understanding, specific parts may be shown in an enlarged manner in the drawings. It should be noted that dimensional ratios among constituent components and so on are not always identical with real ones. It should also be noted that in any sectional view, hatching on a part of members may be omitted in order to facilitate understanding of the sectional structures of the members.

As shown in FIG. 1A, the electrostatic chuck 1 includes an electrostatic chuck (ESC) substrate 10, an adhesive layer 20, and a base plate (base) 30. The electrostatic chuck 1 serves as a temperature adjustment device that adjusts the temperature of a substrate mounted on the electrostatic chuck substrate 10. Also, the base plate 30 serves as a base member that supports the electrostatic chuck substrate 10.

The electrostatic chuck substrate 10 includes a substrate body (base body) 11, an electrostatic electrode 12 and heating elements 13. The electrostatic electrode 12 and the heating elements 13 are built in the substrate body 11. The electrostatic chuck substrate 10 is, for example, formed into a circular plate shape. The electrostatic chuck substrate 10 may have, for example, about 300 mm in size (diameter). The electrostatic chuck substrate 10 may have, for example, about 5 mm in thickness.

The substrate body 11 includes a substrate mounting surface 11A (here, upper surface) and an adhesive surface 11B (here, lower surface) which are opposite from each other. The substrate mounting surface 11A and the adhesive surface 11B are parallel to each other. A substrate W is mounted on the substrate mounting surface 11A. It is noted that in the following description, the substrate body 11 may be regarded as the electrostatic chuck substrate 10.

The substrate body 11 may include a material having an insulation property. Examples of the material of the substrate body 11 include ceramics such as alumina, aluminum nitride, silicon nitride, etc. and an organic material such as silicon resin, polyimide resin, etc. In the exemplary embodiment, ceramics such as alumina or aluminum nitride is employed as the material of the substrate body 11 in view of availability, easiness in processing, comparatively high resistance against plasma or the like, etc. Particularly, it is preferable that aluminum nitride is employed. This is because a large thermal conductivity of aluminum nitride, which is 15 to 250 W/(m·K) can reduce temperature unevenness within the substrate W attracted onto the electrostatic chuck substrate 10.

The electrostatic electrode 12 is an electrode formed into a thin film shape. The electrostatic electrode 12 is provided inside the substrate body 11 so as to be located near the substrate mounting surface 11A. The electrostatic electrode 12 is electrically connected to an attraction power supply. The electrostatic electrode 12 fixes the substrate W on the substrate mounting surface 11A by means of an electrostatic force generated by a voltage applied from the attraction power supply. Examples of a material of the electrostatic electrode 12 include tungsten (W) and molybdenum (Mo). FIG. 1A shows a single electrostatic electrode 12. However, in fact, plural electrodes are disposed on one and the same plane.

The plural heating elements 13 are provided inside the substrate body 11 so as to be located between the electrostatic electrode 12 and the bonding surface 11B. The heating elements 13 are, for example, disposed on a plane parallel to the substrate mounting surface 11A. Each heating element 13 is electrically isolated from the electrostatic electrode 12. Examples of a material of the heating elements 13 include tungsten and molybdenum.

The plural heating elements 13 are electrically connected to a heating power supply. The plural heating elements 13 generate heat in accordance with voltages applied from the heating power supply. The heating elements 13 are divided into plural zones (regions) and controlled individually.

Figure 2:
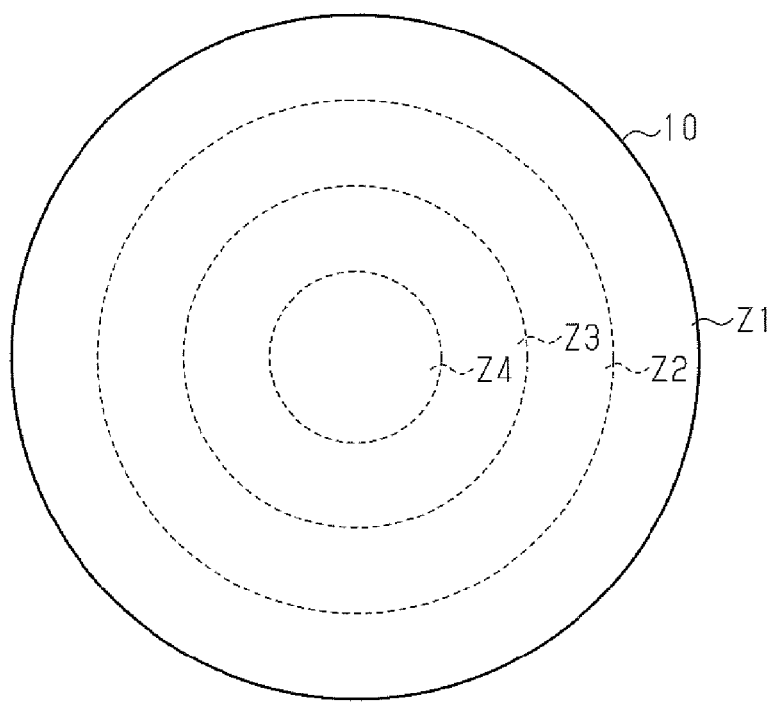
FIG. 2 is a schematic plan view showing the electrostatic chuck according to the exemplary embodiment.

Specifically, as shown in FIG. 2, plural zones Z1, Z2, Z3 and Z4 are set in the electrostatic chuck substrate 10. The zones Z1, Z2, Z3 and Z4 are, for example, set concentrically. The zones Z1, Z2, Z3 and Z4 are defined in order from the outer circumferential edge side of the electrostatic chuck substrate 10 toward a central portion of the electrostatic chuck substrate 10 in a plan view. The plural heating elements 13 shown in FIG. 1A are controlled in each zone Z1 to Z4 so as to make the temperature of the substrate W uniform as a whole.

The electrostatic chuck substrate 10 described above is formed by, for example, stacking a green sheet printed with tungsten and thereafter sintering.

The electrostatic chuck substrate 10 is bonded to an upper surface 30A of the base plate 30 through the adhesive layer 20. The adhesive layer 20 bonds the electrostatic chuck substrate 10 onto the base plate 30. Also, the adhesive layer 20 conducts heat of the electrostatic chuck substrate 10 to the base plate 30. That is, the adhesive layer 20 serves as a bonding agent that bonds the base plate 30 and the electrostatic chuck substrate 10 to each other and also serves as a thermal conduction member. As a material of the adhesive layer 20, a material having high thermal conductivity is preferable. Examples of the material of the adhesive layer 20 include silicon resin. The adhesive layer 20 may be, for example, in a range of about 1.0 mm to about 1.5 mm in thickness.

Examples of a material of the base plate 30 include (i) a metal material such as aluminum and a hard metal alloy, (ii) a composite material of the metal material and a ceramics material and the like. In the exemplary embodiment, aluminum or an alloy thereof is employed in view of availability, easiness in processing, high thermal conductivity, etc. It is noted that in the exemplary embodiment, alumite treatment (insulating layer formation) is applied to a surface of the employed material of the based plate 30. The base plate 30 may be, for example, in a range of about 30 mm to about 40 mm in thickness.

A cooling path 31 is formed in the base plate 30. The cooling path 31 includes a conduit 32, an introduction portion 33, and a discharge portion 34. The introduction portion 33 communicates with a start end portion (an example of one end portion) of the conduit 32. The discharge portion 34 communicates with a final end portion (an example of the other end portion) of the conduit 32. The cooling path 31 (the conduit 32, the introduction portion 33 and the discharge portion 34) is defined by a hole that is opened in the base plate 30.

The conduit 32 is, for example, formed on a plane parallel to the upper surface 30A of the base plate 30. The conduit 32 is, for example, formed on a plane located in an intermediate position in a thickness direction (an illustrated up/down direction) perpendicular to planar directions (an illustrated left/right direction) along which the upper surface 30A of the base plate 30 extends. The conduit 32 is formed to be hollow, so that a cooling medium can flow all over the plane of the base plate 30 through the conduit 32. The conduit 32 in the exemplary embodiment is, for example, formed to be substantially rectangular cylindrical. That is, a sectional shape of the conduit 32 in the lateral direction (here, width direction) of the conduit 32 is substantially rectangle. Also, a connection portion 32X that is connected to the introduction portion 33 is formed in the start end portion of the conduit 32. Furthermore, a connection portion 32Y that is connected to the discharge portion 34 is formed in the final end portion of the conduit 32. The connection portion 32X is, for example, formed in a lower surface of the start end portion of the conduit 32 and is formed to be open toward the introduction portion 33. On the other hand, the connection portion 32Y is formed in the final end portion of the conduit 32 so as to be open toward the discharge portion 34. Here, for example, water or Galden® may be used as the cooling medium.

Figure 3:
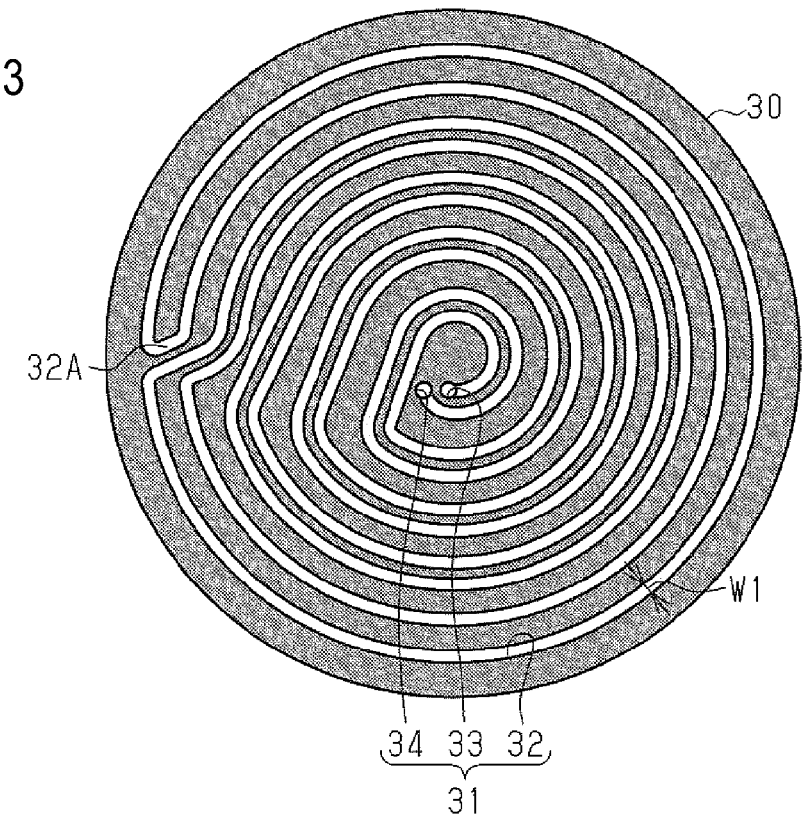
FIG. 3 is a schematic plan view showing a cooling path according to the exemplary embodiment.

FIG. 3 shows an example of the planar shape of the conduit 32. The conduit 32 is formed so that the entire base plate 30 can be cooled by the cooling medium flowing in the conduit 32. For example, the conduit 32 is formed into a substantially spiral shape in a plan view so as to extend toward an outer region from the start end portion connected to the introduction portion 33, which is formed in the substantially central portion in a plan view. Also, the conduit 32 is formed into a substantially spiral shape in a plan view so as to turn to the opposite direction at an intermediate portion 32A located in a region near the outer circumferential edge of the base plate 30. That is, the conduit 32 extends from the intermediate portion 32A toward the final end portion connected to the discharge portion 34, which is formed in the substantially central portion in a plan view. The conduit 32 in the exemplary embodiment is formed into a counterclockwise spiral (a spiral extending toward the outer circumferential edge counterclockwise) extending from the introduction portion 33 to the intermediate portion 32A, and turned back at the intermediate portion 32A. Then, the conduit 32 is formed into a clockwise spiral (a spiral extending toward the central portion in a plan view clockwise) from the intermediate portion 32A to the discharge portion 34. In the conduit 32 according to the exemplary embodiment, the spiral of the conduit 32 extending from the introduction portion 33 to the intermediate portion 32A and the spiral of the conduit 32 extending from the intermediate portion 32A to the discharge portion 34 are substantially in parallel with each other. The introduction portion 33 and the discharge portion 34 formed in the central portion (for example, in a region corresponding to the zone Z4) in a plan view are formed in positions close to each other.

A width W1 of the conduit 32 may be, for example, in a range of about 0.5 mm to about 0.7 mm. A depth D1 of the conduit 32 shown in FIG. 1B may be, for example, in a range of about 15 mm to about 17 mm. A thickness between an upper surface of the conduit 32 and the upper surface 30A of the base plate 30 may be, for example, in a range of 6 mm to 8 mm.

Figure 1B:
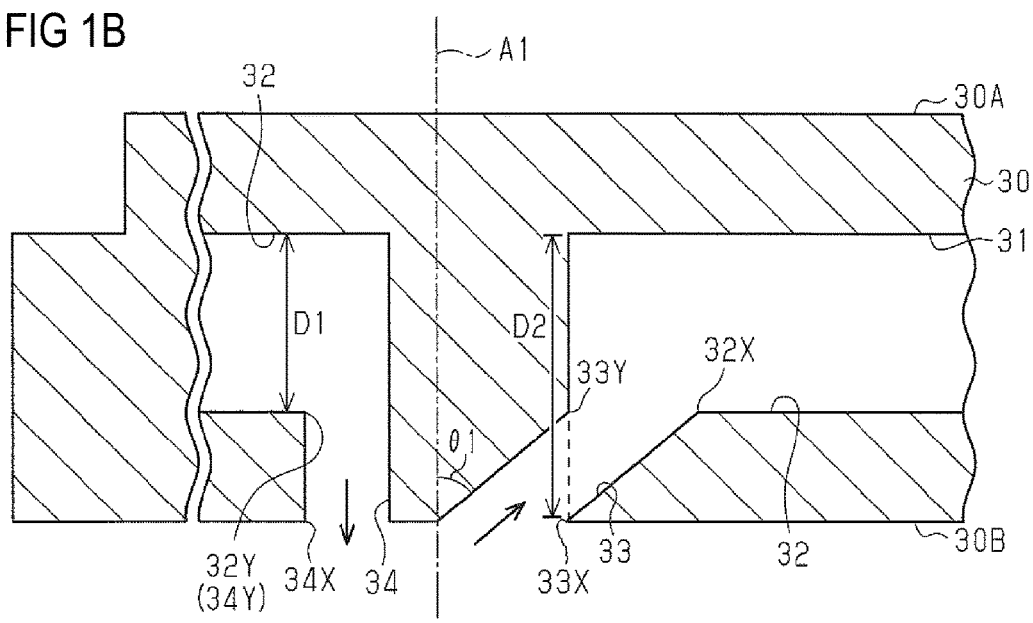
FIG. 1B is a schematic enlarged sectional view in which a part of the electrostatic chuck shown in FIG. 1A is enlarged.

As shown in FIG. 1B, the introduction portion 33 is formed to extend from a lower surface 30B of the base plate 30 toward the start end portion (connection portion 32X) of the conduit 32. The introduction portion 33 introduces the cooling medium, which is low in temperature, into the cooling path 31 (conduit 32). The introduction portion 33 is formed to be inclined toward the lower surface 30B of the base plate 30. The introduction portion 33 is inclined at a predetermined angle θ1 with respect to an axis A1 perpendicular to the upper surface 30A of the base plate 30. Here, the angle θ1 is, for example, an angle formed between the axis A1 and the axis of the introduction portion 33 (for example, where the introduction portion 33 is formed into a cylindrical shape, an axis of the cylinder). The angle θ1 may be, for example, equal to or larger than 1 degree and less than 90 degrees. The introduction portion 33 is formed into a hollow structure. Specifically, the introduction portion 33 is formed with an opening portion 33X and an opening portion 33Y. The opening portion 33X is provided on the lower surface 30B side (start end portion side) of the base plate 30. The opening portion 33Y is provided on the other end portion side (final end portion side). The opening portion 33X is opened toward the outside of the base plate 30. The opening portion 33Y is opened toward the start end portion of the conduit 32. The introduction portion 33 in the exemplary embodiment is, for example, formed into an oblique cylindrical shape. That is, the opening portions 33X and 33Y in the exemplary embodiment are formed into substantially circular shapes in a plan view. A diameter of each opening portion 33X, 33Y may be, for example, in a range of about 8 mm to about 10 mm. In this case, the diameters of the opening portion 33X, 33Y are, for example, larger than the width W1 (see FIG. 3) of the lower surface of the conduit 32. The introduction portion 33 and the conduit 32 communicate with each other through the connection portion 32X and the opening portion 33Y.

The discharge portion 34 is formed to extend from the lower surface 30B of the base plate 30 toward the final end portion (connection portion 32Y) of the conduit 32. The discharge portion 34 can discharge the cooling medium, which has cooled the base plate 30 and increased in temperature, to the outside of the base plate 30. The discharge portion 34 is, for example, formed to extend perpendicularly to the lower surface 30B of the base plate 30. That is, the discharge portion 34 in the exemplary embodiment is formed to extend along the axis A1. The discharge portion 34 is formed into a hollow structure. Specifically, the discharge portion 34 is formed with an opening portion 34X and an opening portion 34Y. The opening portion 34X is provided on the lower surface 30B side (final end portion side) of the base plate 30. The opening portion 34Y is provided on the other end portion side (start end portion side). The opening portion 34X is opened toward the outside of the base plate 30. The opening portion 34Y is opened toward the connection portion 32Y (final end portion) of the conduit 32. The conduit 32 and the discharge portion 34 communicate with each other through the connection portion 32Y and the opening portion 34Y. The discharge portion 34 in the exemplary embodiment is formed into, for example, a straight cylindrical shape.

The introduction portion 33 and the discharge portion 34 are, for example, connected to a cooling medium control device (not shown) provided outside the electrostatic chuck 1. The cooling medium control device introduces the cooling medium into the conduit 32 through the introduction portion 33, passes the cooling medium through the conduit 32 formed all over the plane of the base plate 30, and discharges the cooling medium from the discharge portion 34. When the cooling medium is thus allowed to flow into the cooling path 31 so that the cooling medium can flow all over the plane of the base plate 30, the whole of the base plate 30 can be cooled, and the upper surface 30A of the base plate 30 can be equalized in temperature. Thus, the temperature of the substrate W attracted and retained on the electrostatic chuck substrate 10 shown in FIG. 1A can be adjusted to a desired temperature.

The cooling path 31 (the conduit 32, the introduction portion 33 and the discharge portion 34) is formed to avoid electrode holes (not shown) formed in the base plate 30, such as electrode holes into which electrodes for electrically connecting the electrostatic electrodes 12 with the attraction power supply can be inserted.

Figure 4:
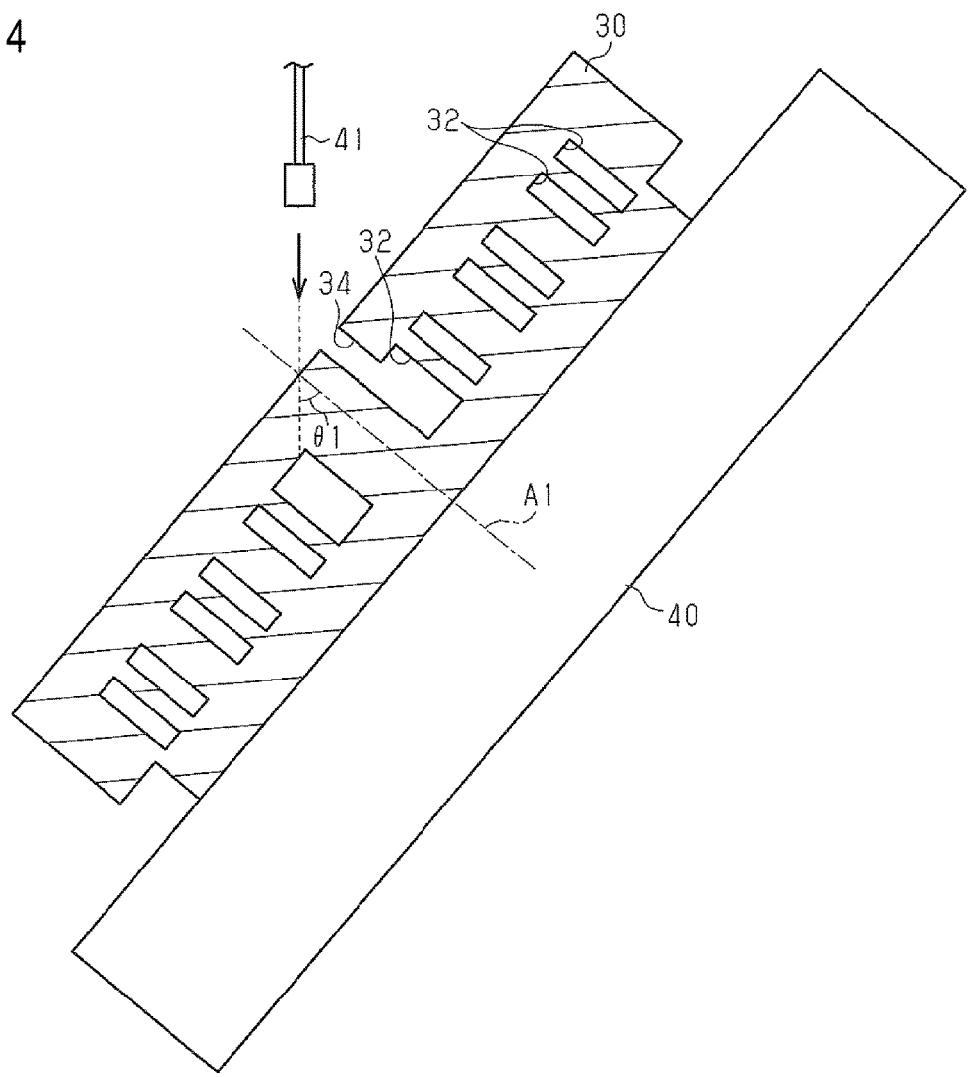
FIG. 4 is an explanatory view showing an example of a method for manufacturing the electrostatic chuck according to the exemplary embodiment.

For example, the base plate 30 described above can be manufactured in the following method. First, the conduit 32 and the discharge portion 34 are formed in the base plate 30 by a well-known technique. Next, as shown in FIG. 4, the base plate 30 in which the conduit 32 and the discharge portion 34 have been formed is, for example, mounted on a stage 40 of a five-axis processing machine. Then, the obliquely cylindrical introduction portion 33 to be connected to the start end portion of the conduit 32 is formed by a tool 41 such as a drill in a state where the stage 40 is inclined in accordance with a desired angle θ1. By the above-described process, the base plate 30 in the exemplary embodiment can be manufactured.

Figure 9:
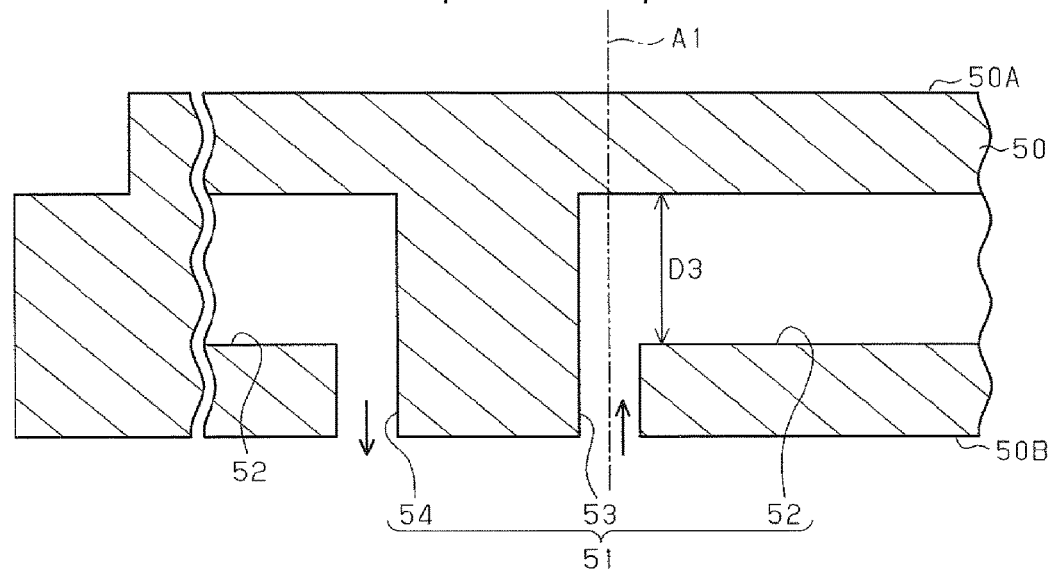
FIG. 9 is a schematic sectional view showing an electrostatic chuck of the comparative example.

FIG. 9 shows a base plate 50 of an electrostatic chuck according to a comparative example. The base plate 50 is formed with an introduction portion 53 to be connected to a start end portion of a conduit 52. The introduction portion 53 is formed to extend perpendicularly to a lower surface 50B of the base plate 50 in the same manner as a discharge portion 54 to be connected to a final end portion of the conduit 52 and the discharge portion 34 in the exemplary embodiment. That is, the introduction portion 53 of the comparative example is formed into a straight cylindrical shape. As a result of intensive research, the inventor found that in the comparative example, the temperature of an upper surface 50A of the base plate 50 near a position where the upper surface 50A overlaps the introduction portion 53 in a plan view tends to be lower than the temperature of other regions. It is noted that in the base plate 50 of the comparative example, a cooling path 51 is constituted by the conduit 52, the introduction portion 53 and the discharge portion 54.

Figure 6:
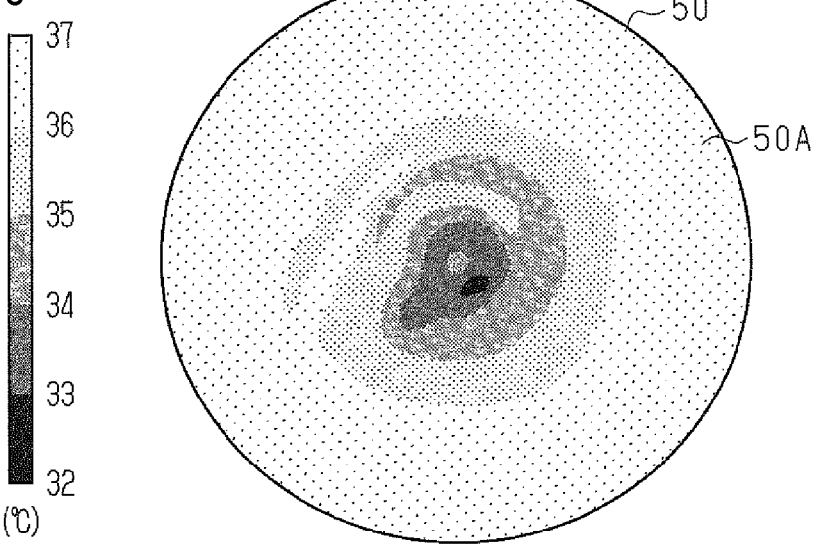
FIG. 6 is an explanatory view showing an analysis result of an electrostatic chuck of a comparative example.

FIG. 6 shows an analysis result of variations of temperature in the upper surface 50A of the base plate 50 of the comparative example. Specifically, FIG. 6 shows a result of fluid analysis performed with analysis software NX® made by SIEMENS AG. The base plate 50, of the comparative example, used in the analysis was different from the base plate 30 only in that the introduction portion 53 was formed into the straight cylindrical shape. The analysis was performed on condition that a total heat transfer quantity in the upper surface 50A of the base plate 50 was 3.5 kW, a heat flux in the upper surface 50A of the base plate 50 was 0.047 W/mm$^2$, a flow rate at the inlet of the introduction portion 53 was 5 L/min, and a temperature at the inlet of the introduction portion 53 was 20° C. It was further assumed that a pressure at the outlet of the discharge portion 54 was 0 MPa and that an atmospheric condition was vacuum.

As is apparent from the analysis result shown in FIG. 6, the temperature in a region of a central portion in a plan view (for example, a region corresponding to the zone Z4) where the introduction portion 53 is formed is lower than the temperatures in the other regions (regions corresponding to the respective zones Z1 to Z3 on the outer circumferential edge side). Also, the region of the central portion in a plan view, which is close to the introduction portion 53, is the lowest in temperature in all the upper surface 50A of the base plate 50. The reason why the temperature of the upper surface 50A near the introduction portion 53 is lower than that in any other region can be considered as follows. That is, the temperature of the cooling medium flowing in the cooling path 51 is low at a point of time when the cooling medium is introduced into the introduction portion 53. The temperature of the cooling medium increases gradually during the process in which the cooling medium passes through the conduit 52 and is discharged from the discharge portion 54. Therefore, the temperature near the inlet of the introduction portion 53 and the temperature near the connection portion between the introduction portion 53 and the conduit 52 are low. As a result, it is considered that the temperature near a portion, which overlaps the introduction portion 53 in a plan view, of the upper surface 50A of the base plate 50 tends to be lower than that in any other region.

Then, in the base plate 30 according to the exemplary embodiment, as described above, the introduction portion 33 is formed into the oblique cylindrical shape. Thus, a distance between the inlet of the introduction portion 33 (that is, the opening portion 33X) and the connection portion 32X of the conduit 32 is longer than that in the comparative example in which the introduction portion 53 is formed into the straight cylindrical shape. Accordingly, the temperature of the cooling medium flowing in the cooling path 31 increases gradually while absorbing heat of the base plate 30 around the cooling medium until the cooling medium is introduced into the conduit 32 through the opening portion 33X. As a result, the temperature of the cooling medium in the connection portion between the introduction portion 33 and the conduit 32 can be made higher than that in the base plate 50 of the comparative example. Thus, the temperature near a portion, which overlaps the connection portion between the introduction portion 33 and the conduit 32 in a plan view, of the upper surface 30A can be made higher than that in the comparative example, and made closer to the temperature in any other region of the upper surface 30A. It is therefore possible to reduce a temperature difference (suppress a temperature unevenness) in the upper surface 30A of the base plate 30.

Furthermore, in the base plate 30, the introduction portion 33 formed into the substantially oblique cylindrical shape is connected (in communication) to the conduit 32 through the lower surface of the conduit 32. Thus, as shown in FIG. 1B, the sectional structure of the connection portion between the introduction portion 33 and the conduit 32 is formed to be deeper on the lower surface 30B side than the sectional structure of the connection portion between the discharge portion 34 and the conduit 32 (or the connection portion between the introduction portion 53 and the conduit 52). That is, a depth D2 of the connection portion (hollow portion) between the introduction portion 33 and the conduit 32 is deeper on the lower surface 30B side than a depth D1 of the connection portion (hollow portion) between the discharge portion 34 and the conduit 32 (or a depth D3 of the connection portion between the introduction portion 53 and the conduit 52). As shown in FIG. 1B, the depth D2 is a length between (i) an upper end of a side surface of the conduit 32 and (ii) an intersection point between an extended line of the side surface of the conduit 32 (indicated by a dashed line in FIG. 1B) and the introduction portion 33. It is noted that in this exemplary embodiment, the conduit 32 and the introduction portion 33 are configured so that the extension line of the side surface of the conduit 32 intersects the introduction portion 33. Also, in this exemplary embodiment, the depth D1 is identical with a height of the conduit 32 (a height of the hollow structure) at the final end portion thereof, and the depth D3 is identical with a height of the conduit 52 (a height of the hollow structure) at a start end portion thereof.

With this configuration, a sectional area of the connection portion between the introduction portion 33 and the conduit 32 is larger than that of the connection portion between the introduction portion 53 and the conduit 52. Accordingly, a flow velocity of the cooling medium in the connection portion between the introduction portion 33 and the conduit 32 is slower than that in the comparative example (a flow velocity in the connection portion between the introduction portion 53 and the conduit 52), which leads to a thick thermal boundary layer. As a result, a heat conduction coefficient between the cooling medium and the base plate 30 becomes low. As a result, the temperature hardly decreases near the portion, which overlaps the connection portion between the introduction portion 33 and the conduit 32 in a plan view, of the upper surface 30A. Therefore, the temperature near the portion, which overlaps the connection portion between the introduction portion 33 and the conduit 32 in a plan view, of the upper surface 30A can be made closer to the temperature in the other regions, so that the temperature unevenness in the upper surface 30A of the base plate 30 can be suppressed.

Figure 5:
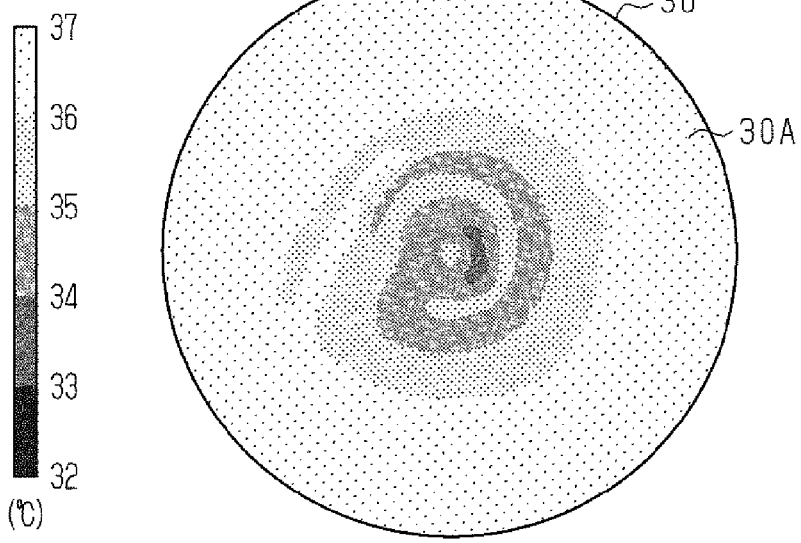
FIG. 5 is an explanatory view showing an analysis result of the electrostatic chuck according to the exemplary embodiment.

FIG. 5 shows an analysis result about temperature variations in the upper surface 30A of the base plate 30 in the electrostatic chuck 1 according to the exemplary embodiment. Specifically, FIG. 5 shows a result of fluid analysis that was performed with analysis software NX® made by SIEMENS AG in the same manner as the fluid analysis which has been described above with reference to FIG. 6. The analysis was performed on condition that a total heat transfer quantity in the upper surface 30A of the base plate 30 was 3.5 kW, a heat flux in the upper surface 30A of the base plate 30 was 0.047 W/mm$^2$, a flow rate at the opening portion 33X of the introduction portion 33 was 5 L/min, and a temperature at the opening portion 33X was 20° C. It is also assumed that a pressure at the opening portion 34X of the discharge portion 34 was 0 MPa and that the atmospheric condition was vacuum. The angle θ1 between the axis A1 and the cylindrical axis of the introduction portion 33 was 50 degrees. That is, among the analysis conditions, the analysis whose result is shown in FIG. 5 and the analysis whose result is shown in FIG. 6 were different only in the shape of the introduction portion 33, and the other conditions were set to be identical with each other.

As is apparent from the analysis result shown in FIG. 5, in the case where the introduction portion 33 is not formed into the straight cylindrical shape but is formed into the oblique cylindrical shape, the temperature in the portion, which overlaps the connection portion between the introduction portion 33 and the conduit 32 in a plan view, of the upper surface 30A (that is, the portion of the upper surface 30A almost at the center in a plan view) is higher than that in the comparative example. Therefore, the temperature differences from the other regions are reduced. It can be considered that this is caused by increase in distance between the opening portion 33X of the introduction portion 33 and the conduit 32, increase in sectional area of the connection portion between the introduction portion 33 and the conduit 32, and the like.

Next, description will be given on evaluations of a relationship between the inclination angle of the introduction portion 33 and the temperature near the portion, which overlaps the connection portion 32X in a plan view, of the upper surface 30A.

Fluid analysis was performed for the respective cases where the inclination angle of the introduction portion 33, that is, the angle θ1 was set at 0 degrees, 25 degrees and 50 degrees, on the same conditions as the analysis conditions described in FIGS. 5 and 6 so as to analyze the temperature near the portion, which overlaps the connection portion 32X in a plan view, of the upper surface 30A. The analysis results of the three angles θ1 were plotted in a graph as shown in FIG. 7.

Figure 7:
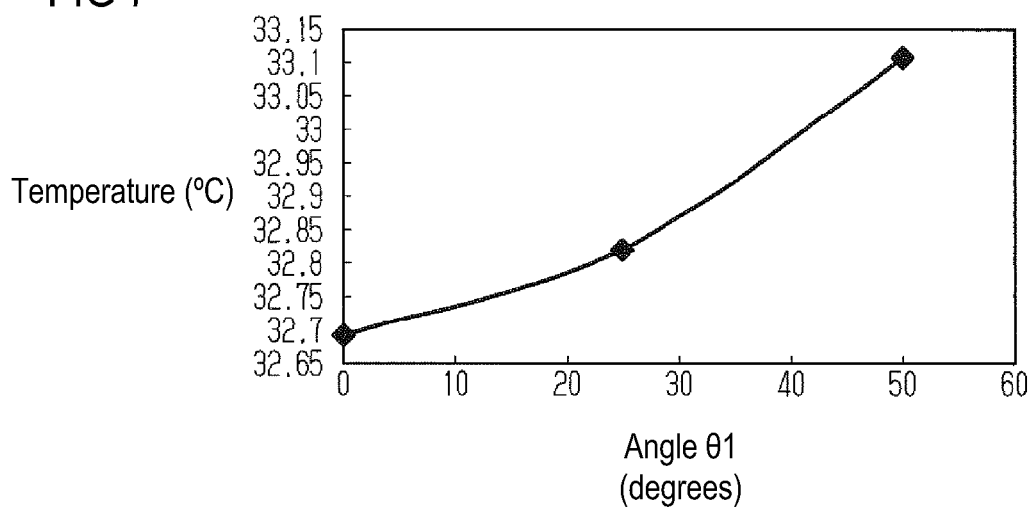
FIG. 7 is an explanatory view showing an analysis result of the electrostatic chuck according to the exemplary embodiment.

As shown in FIG. 7, the temperature of the upper surface 30A was 32.692° C. when the angle θ1 was 0 degrees, while the temperature of the upper surface 30A increased to 32.823° C. when the angle θ1 was set at 25 degrees, and the temperature of the upper surface 30A further increased to 33.105° C. when the angle θ1 was set at 50 degrees. That is, the temperature near the portion, which overlaps the connection portion 32X in a plan view, of the upper surface 30A increased with increasing the angle θ1. From the analysis results, it is proved that the temperature of the upper surface 30A in the central portion in a plan view where the introduction portion 33 and the connection portion 32X are formed can be made closer to the temperature of the upper surface 30A in a region on the outer circumferential edge side as the angle θ1 is increased. However, as the angle θ1 is increased, a plane size (plane area) of the introduction portion 33 increases so as to narrow a region where the conduit 32 and the discharge portion 34 is formed. Thus, the freedom of arrangement of the conduit 32 and the discharge portion 34 get lower. Furthermore, since the introduction portion 33 is provided inside the base plate 30, the angle θ1 must be less than 90 degrees.

From above, the angle θ1 is preferably equal to or larger than 25 degrees and less than 90 degrees, and more preferably equal to or larger than 50 degrees and less than 80 degrees from the viewpoint of the heat uniformity in the base plate 30 and the plane size of the introduction portion 33.

As has been described above, the exemplary embodiment provides the following advantageous effects.

(1) The introduction portion 33 connected to the start end portion of the conduit 32 is formed into the oblique cylindrical shape. With this structure, the distance between the inlet of the introduction portion 33 (that is, the opening portion 33X) and the connection portion 32X of the conduit 32 is longer than that in the comparative example in which the introduction portion 53 is formed into the straight cylindrical shape. Thus, the temperature near the portion, which overlaps the connection portion between the introduction portion 33 and the conduit 32 in a plan view, of the upper surface 30A can be made higher than that in the comparative example, and made closer to the temperatures in the other regions. As a result, the variation of temperature in the upper surface 30A of the base plate 30 can be more suppressed than in the comparative example. Thus, the variation of temperature in the surface mounting surface 11A of the electrostatic chuck substrate 10 can be more suppressed than in the comparative example.

(2) The introduction portion 33 formed into the oblique cylindrical shape is connected (in communication) with the conduit 32 through the lower surface of the conduit 32. With this structure, the sectional area of the connection portion between the introduction portion 33 and the conduit 32 is larger than that of the connection portion between the introduction portion 53 formed into the straight cylindrical shape and the conduit 52. Accordingly, the flow velocity of the cooling medium in the connection portion between the introduction portion 33 and the conduit 32 is slower than that in the comparative example, so that the heat conduction coefficient between the cooling medium and the base plate 30 can be reduced. As a result, the temperature hardly decreases near the portion, which overlaps the connection portion between the introduction portion 33 and the conduit 32 in a plan view, of the upper surface 30A. Therefore, the variation of temperature in the upper surface 30A of the base plate 30 can be further suppressed suitably.

Other Exemplary Embodiments

The aforementioned exemplary embodiment may be modified suitably and carried out in the following forms.

In the above exemplary embodiment, the conduit 32 is formed to have substantially the same depth from the start end portion to the final end portion. However, the shape of the conduit 32 is not limited thereto.

Figure 8:
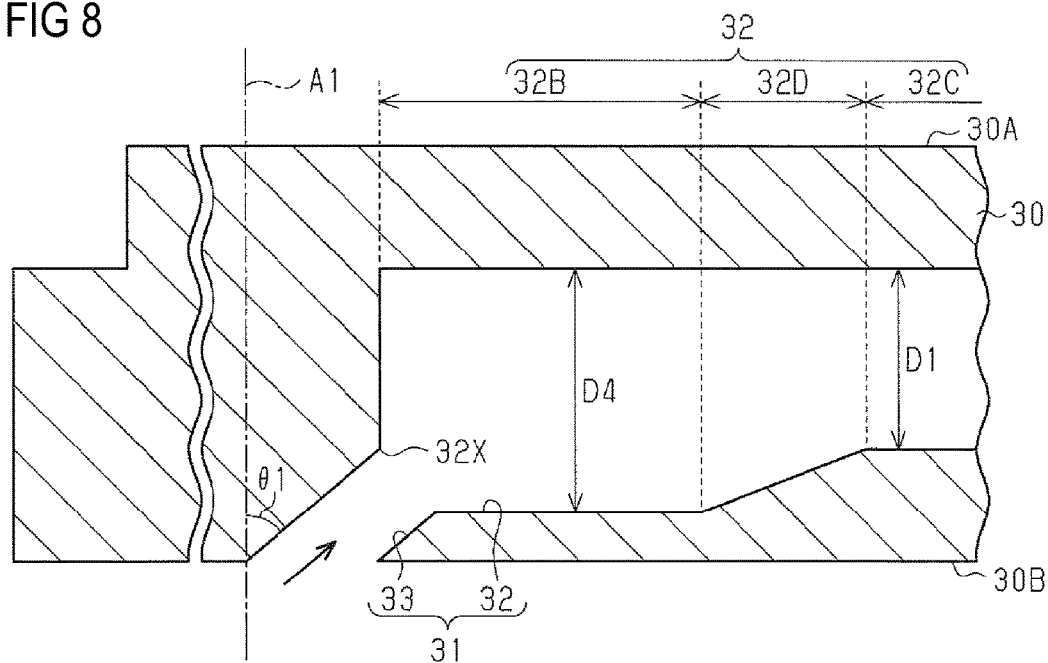
FIG. 8 is a schematic sectional view showing an electrostatic chuck according to a modification example.

For example, as shown in FIG. 8, a depth D4 of a conduit 32B of the conduit 32 near the start end portion (near the connection portion 32X) may be formed to be deeper on the lower surface 30B side of the base plate 30 than a depth D1 of a conduit 32C of the conduit 32 excluding the vicinity of the start end portion of the conduit 32. Specifically, in this modification, an upper surface of the conduit 32B is formed on the same plane as an upper surface of the conduit 32C, while a lower surface of the conduit 32B is formed on a plane closer to the lower surface 30B of the base plate 30 than a lower surface of the conduit 32C. In this case, a width of the conduit 32B is set to be substantially equal to that of the conduit 32C. Accordingly, a sectional area of the conduit 32B is larger than that of the conduit 32C. Here, the conduit 32B is a part of the conduit 32 and is located in and near the start end portion of the conduit 32. A conduit 32D is formed between the conduit 32B and the conduit 32C. A lower surface of the conduit 32D is formed as a slope that is inclined to extend from the lower surface of the conduit 32B toward the lower surface of the conduit 32C located above the lower surface of the conduit 32B. That is, a depth of the conduit 32D is formed to decrease gradually from the conduit 32B side toward the conduit 32C side. On the other hand, an upper surface of the conduit 32D is formed on the same plane as the upper surfaces of the conduits 32B and 32C. Furthermore, a width of the conduit 32D is substantially equal to the widths of the conduit 32B and conduit 32C.

In this manner, in this modification, the depth D4 of the conduit 32B near the connection portion 32X connected to the introduction portion 33 is deeper than the depth D1 of the conduit 32C which is a part of the conduit 32 excluding the vicinity of the connection portion 32X. Accordingly, the flow velocity of the cooling medium in the conduit 32B becomes slow. Thus, the thermal boundary layer becomes so thick that the heat conduction coefficient between the cooling medium flowing in the conduit 32B and the base plate 30 is reduced. As a result, the temperature hardly decreases near the portion, which overlaps the conduit 32B in a plan view, of the upper surface 30A. Therefore, the variation of temperature in the upper surface 30A of the base plate 30 can be reduced suitably.

In the above exemplary embodiment, the introduction portion 33 is connected to the conduit 32 through the lower surface of the start end portion of the conduit 32. The introduction portion 33 and the conduit 32 are, whoever, not limited thereto. For example, the introduction portion 33 may be connected to the conduit 32 through a side surface (surface extending along the axis A1) of the start end portion of the conduit 32. That is, in this case, the connection portion 32X of the conduit 32 is formed in the side surface of the start end portion of the conduit 32.

In the above described embodiment, the introduction portion 33 and the discharge portion 34 are provided in positions close to each other substantially in the central portion of the base plate 30 in a plan view. That is, the introduction portion 33 and the discharge portion 34 are provided in a region corresponding to one zone (zone Z4 in the above described embodiment). The introduction portion 33 and the discharge portion 34 are, however, not limited thereto. For example, the introduction portion 33 and the discharge portion 34 may be provided in regions corresponding to zones different from each other. For example, the introduction portion 33 may be provided in the substantially central portion (region corresponding to the zone Z4) of the base plate 30 in a plan view, while the discharge portion 34 may be provided in an outer circumferential region (region corresponding to the zone Z1) of the base plate 30.

In the above described embodiment, the introduction portion 33 is formed into the oblique cylindrical shape. That is, the opening portions 33X and 33Y of the introduction portion 33 are formed into substantially circular shapes in a plan view. The introduction portion 33 is, however, not limited thereto. The structure of the introduction portion 33 may be changed so that the planar shape of each opening portion 33X, 33Y has a polygonal shape such as a triangular shape, a rectangular shape, a pentagonal shape, etc. or an oval shape.

In the above exemplary embodiment, the discharge portion 34 is formed into the straight cylindrical shape. The discharge portion 34 is, however, not limited thereto. For example, the discharge portion 34 may be formed into a polygonal cylindrical shape such as a triangular cylindrical shape, a rectangular cylindrical shape, a pentagonal cylindrical shape, etc. or an oval cylindrical shape. Furthermore, the discharge portion 34 may be formed to extend obliquely from the lower surface 30B of the base plate 30 toward the final end portion (connection portion 32Y) of the conduit 32.

In the above exemplary embodiment, the conduit 32 is formed into the rectangular cylindrical shape. The conduit 32 is, however, not limited thereto. For example, the conduit 32 may be formed into a circular cylindrical shape, an oval cylindrical shape, a triangular cylindrical shape or a pentagonal cylindrical shape.

What is claimed is:

1. An electrostatic chuck comprising:
a base member that includes a cooling path through which a cooling medium flows; and
an electrostatic chuck substrate that is connected to an upper surface of the base member through an adhesive layer so as to attract and retain a substrate to be mounted on an upper surface of the electrostatic chuck substrate; wherein
the cooling path comprises
an introduction portion to which the cooling medium is introduced from an outside of the base member,
a discharge portion from which the cooling medium is discharged to the outside of the base member, and
a conduit including
a start end portion that is directly coupled to the introduction portion to directly communicate with the introduction portion, and
a final end portion that communicates with the discharge portion,
wherein an entirety of the conduit extends in a direction parallel to the upper surface of the base member,
the introduction portion has an oblique cylindrical shape and is inclined toward a lower surface of the base member and at a predetermined angle with respect to an axis perpendicular to the upper surface of the base member, and
the introduction portion extends from the lower surface of the base member toward the start end portion of the conduit.

2. The electrostatic chuck of claim 1, wherein the introduction portion is connected to the conduit on a lower surface of the start end portion of the conduit.

3. The electrostatic chuck of claim 1, wherein
an upper surface of the start end portion of the conduit is formed on the same plane as an upper surface of the other parts of the conduit than the start end portion, and
a lower surface of the start end portion of the conduit is formed on a plane closer to the lower surface of the base member than a lower surface of the other parts of the conduit than the start end portion.

4. The electrostatic chuck of claim 1, wherein the discharge portion extends along the axis from the lower surface of the base member toward the final end portion of the conduit.

5. The electrostatic chuck of claim 1, wherein
the electrostatic chuck substrate comprises
an electrostatic electrode that attracts the substrate, and
a heating element that heats the substrate.

6. The electrostatic chuck of claim 1, wherein the predetermined angle is equal to or lager than 25 degrees and less than 90 degrees.

7. The electrostatic chuck of claim 1, wherein a depth of a connection portion between the introduction portion and the conduit is deeper than that of a connection portion between the discharge portion and the conduit.

8. The electrostatic chuck of claim 1, wherein the discharge portion has a straight cylindrical shape.

9. An electrostatic chuck comprising:
a base member that includes a cooling path through which a cooling medium flows; and
an electrostatic chuck substrate that is connected to an upper surface of the base member through an adhesive layer so as to attract and retain a substrate to be mounted on an upper surface of the electrostatic chuck substrate,
wherein
the cooling path comprises
    an introduction portion to which the cooling medium is introduced from an outside of the base member,
    a discharge portion from which the cooling medium is discharged to the outside of the base member, and
    a conduit including
        a start end portion that communicates with the introduction portion, and
        a final end portion that communicates with the discharge portion,
the introduction portion is inclined toward a lower surface of the base member and at a predetermined angle with respect to an axis perpendicular to the upper surface of the base member,
the introduction portion extends from the lower surface of the base member toward the start end portion of the conduit,
the introduction portion and the discharge portion are formed in a central portion of the base member in a plan view,
the conduit is formed into a spiral shape extending from the introduction portion toward an outer circumferential region of the base member, is turned back in the outer circumferential region, and then formed into a spiral shape extending from the outer circumferential region toward the discharge portion, and
a part of the conduit extending from the outer circumferential region toward the discharge portion is in parallel with a part of the conduit extending from the introduction portion toward the outer circumferential region.

10. A base member for supporting an electrostatic chuck substrate, the base member comprising:
an lower surface;
an upper surface that is opposite from the lower surface; and
a cooling path including
    an introduction portion to which a cooling medium is introduced from an outside,
    a discharge portion from which the cooling medium is discharged to the outside, and
    a conduit including
        a start end portion that is directly coupled to the introduction portion to directly communicate with the introduction portion, and
        a final end portion that communicates with the discharge portion,
        wherein an entirety of the conduit extends in a direction parallel to the upper surface,
the cooling path configured to allow the cooling medium to flow therethrough, wherein
the introduction portion has an oblique cylindrical shape and is inclined toward the lower surface and at a predetermined angle with respect to an axis perpendicular to the upper surface, and
the introduction portion extends from the lower surface toward the start end portion of the conduit.

* * * * *